(12) United States Patent
Hirai

(10) Patent No.: US 6,913,944 B2
(45) Date of Patent: Jul. 5, 2005

(54) ORGANIC THIN-FILM TRANSISTOR MANUFACTURING METHOD, ORGANIC THIN-FILM TRANSISTOR, AND ORGANIC THIN-FILM TRANSISTOR SHEET

(75) Inventor: Katsura Hirai, Hachioji (JP)

(73) Assignee: Konica Minolta Holdings, Inc. (JP)

( * ) Notice: Subject to any disclaimer, the term of this patent is extended or adjusted under 35 U.S.C. 154(b) by 0 days.

(21) Appl. No.: 10/742,194

(22) Filed: Dec. 19, 2003

(65) Prior Publication Data

US 2004/0129937 A1 Jul. 8, 2004

(30) Foreign Application Priority Data

Dec. 26, 2002 (JP) .................................... 2002-376793

(51) Int. Cl.[7] .............................................. H01L 51/40
(52) U.S. Cl. .............................. 438/99; 257/E51.005; 257/E51.006; 257/E51.01
(58) Field of Search .................. 438/99; 257/E51.005, 257/E51.006, E21.007, E51.01

(56) References Cited

U.S. PATENT DOCUMENTS 5,705,826 A * 1/1998 Aratani et al. ............... 257/40
6,734,038 B2 * 5/2004 Shtein et al. ................. 438/99
6,740,900 B2 * 5/2004 Hirai ........................... 257/40
2002/0155729 A1 * 10/2002 Baldwin et al. ............. 438/780
2003/0183915 A1 * 10/2003 Scheifers et al. ........... 257/682
2004/0077122 A1 * 4/2004 Wu et al. ..................... 438/99

* cited by examiner

Primary Examiner—Trung Dang
(74) Attorney, Agent, or Firm—Cantor Colburn LLP

(57) ABSTRACT

An organic thin-film transistor manufacturing method and an organic thin-film transistor manufactured by the method are disclosed, the method comprising the steps of a) forming a gate electrode on a substrate, b) forming a gate insulating layer on the substrate, c) forming an organic semiconductor layer on the substrate, d) forming an organic semiconductor layer protective layer on the organic semiconductor layer, e) removing a part of the organic semiconductor layer protective layer, and f) forming a source electrode and a drain electrode at portions where the organic semiconductor layer protective layer has been removed, so that the source electrode and drain electrode contacts the organic semiconductor layer.

16 Claims, 7 Drawing Sheets

FIG. 4 - (1)
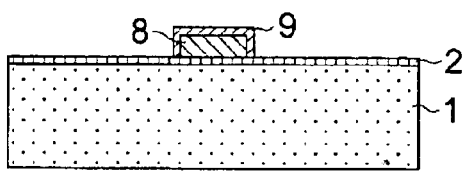
FIG. 4 - (2)
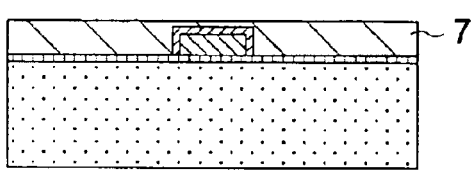
FIG. 4 - (3)
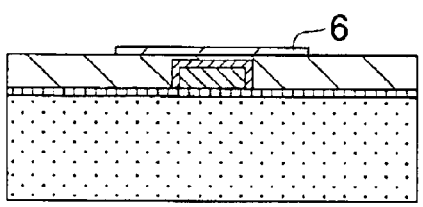
FIG. 4 - (4)
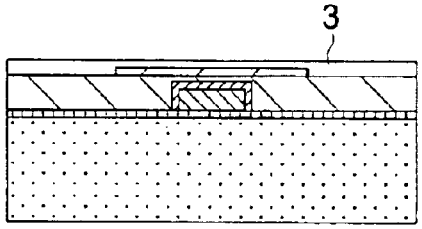
FIG. 4 - (5)
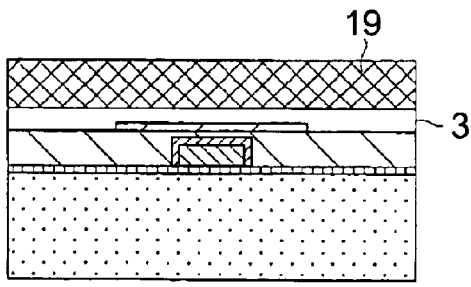
FIG. 4 - (6)
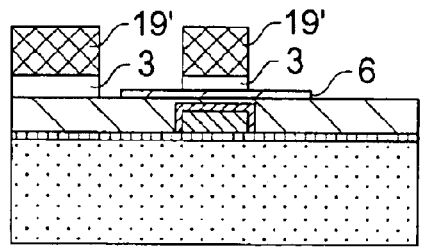
FIG. 4 - (7)
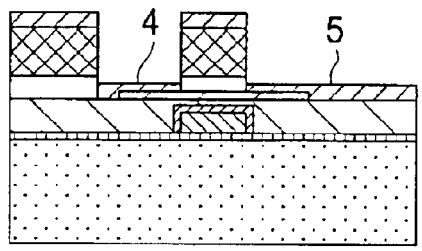
FIG. 4 - (8)
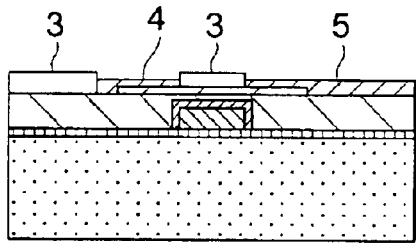

FIG. 9 - (1)
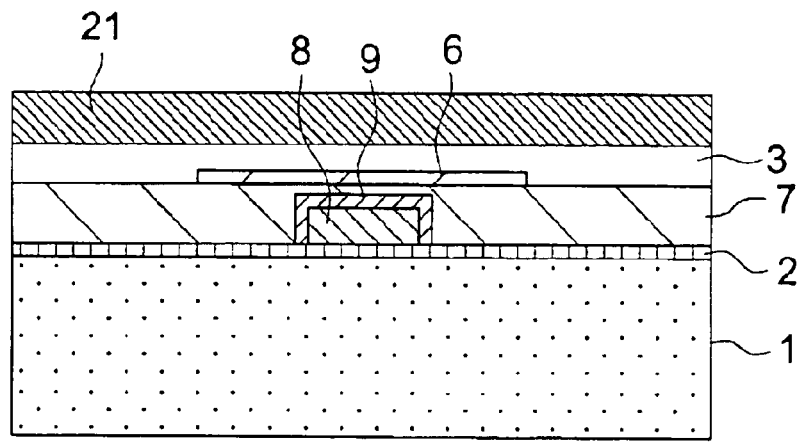
FIG. 9 - (2)
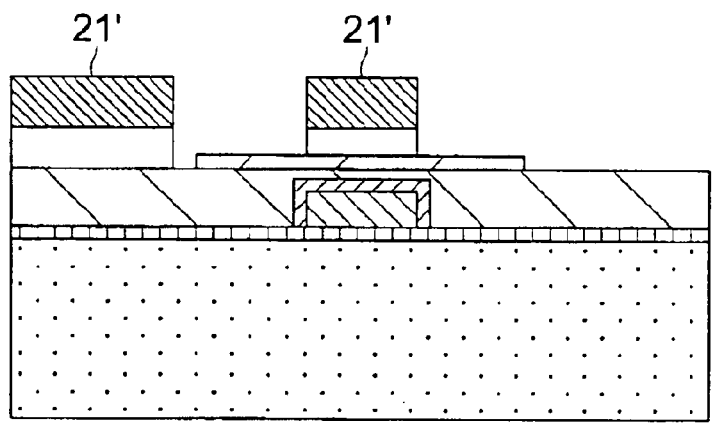
FIG. 9 - (3)
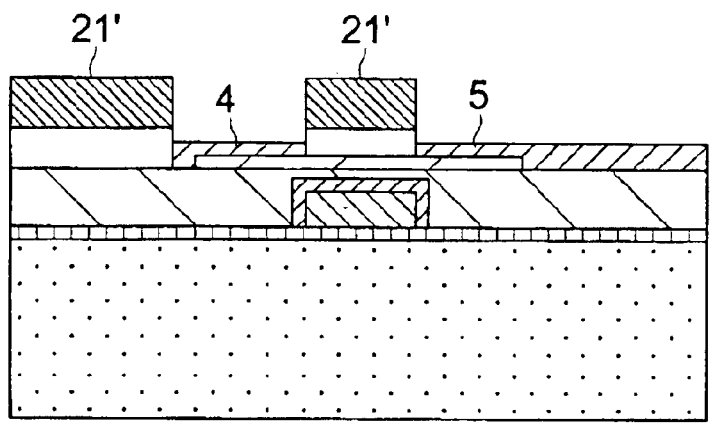

ORGANIC THIN-FILM TRANSISTOR MANUFACTURING METHOD, ORGANIC THIN-FILM TRANSISTOR, AND ORGANIC THIN-FILM TRANSISTOR SHEET

FIELD OF THE INVENTION

The present invention relates to an organic thin-film transistor manufacturing method, an organic thin-film transistor manufactured by the method, an organic thin-film transistor, and an organic thin-film transistor sheet.

BACKGROUND OF THE INVENTION

With the spread of information terminals, there are increasing demands for a flat panel display that serves as a display for a computer. Further, with development of the information technology, there has been increased a chance for information offered in a form of a sheet of paper medium in the past to be offered in an electronic form. An electronic paper or a digital paper is demanded increasingly as a display medium for a mobile that is thin, lightweight and handy.

In the case of a display device of a flat sheet type, a display medium is generally formed using an element that employs a liquid crystal, organic EL or electrophoresis method. In the display medium of this kind, a technology for using an active driving element comprised of a thin-film transistor (TFT), serving as an image driving element, is the main current for ensuring uniform image brightness and an image rewriting speed.

The TFT is manufactured by a process comprising forming, on a glass substrate, a semiconductor layer of a-Si (amorphous silicone) or p-Si (poly-silicone) and metal films of source, drain and gate electrodes, in the order. In the manufacture of a flat panel display employing such a TFT, a photolithography step with high precision is required in addition to a thin layer forming step requiring a vacuum line carrying out a CVD method or a sputtering method or a high temperature treatment step, which,results in great increase of manufacturing cost or running cost. Recent demand for a large-sized display panel further increases those costs described above.

In order to overcome the above-described defects, an organic thin-film transistor employing an organic semiconducting material has been extensively studied (refer to Japanese Patent O.P.I. Publication No. 10-19000 and "Advanced Material", 2002, No. 2, p. 99 (review)). Since the organic thin-film transistor can be manufactured at low temperature employing a lightweight substrate difficult to be broken, a flexible display employing a resin film as a substrate can be realized (refer to SID '02 Digest P. 57). Further, employing an organic semiconducting material allowing a wet process such as a printing method or a coating method, a display manufacturing process can be realized which provides excellent productivity and reduced cost.

However, an organic thin-film transistor, when allowed to stand in air, deteriorates, resulting in lowering of transistor properties. Further, an organic thin-film transistor, when manufactured by a process comprising forming an organic semiconductor layer, followed by coating of a light sensitive resin layer, and development of the light sensitive resin layer air, results in deterioration of transistor properties due to a solvent used for coating or components contained in a developer used for development.

An organic thin-film transistor employing a substrate such as a resin plate or a resin film is easily folded as compared with that employing a glass plate. Therefore, the former has problem in that properties as a transistor deteriorate due to folding, or due to light.

SUMMARY OF THE INVENTION

The present invention has been made in view of the above. An object of the invention is to provide an organic thin-film transistor manufacturing method minimizing deterioration during the manufacture of transistor properties and minimizing deterioration with time or due to folding of the transistor properties, and an organic thin-film transistor manufactured by the method. Another object of the invention is to provide an organic thin-film transistor and an organic thin-film transistor sheet, each minimizing deterioration with time or due to folding of the transistor properties.

BRIEF DESCRIPTION OF THE DRAWINGS

[Brief Explanation of the Drawings]

Figure 1:
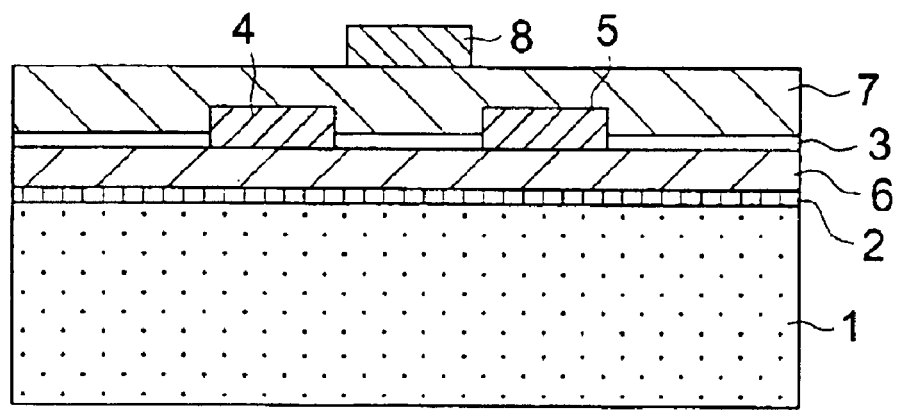

FIG. 1 is a structural example of the organic thin-film transistor of the invention (top gate type).

Figure 2:
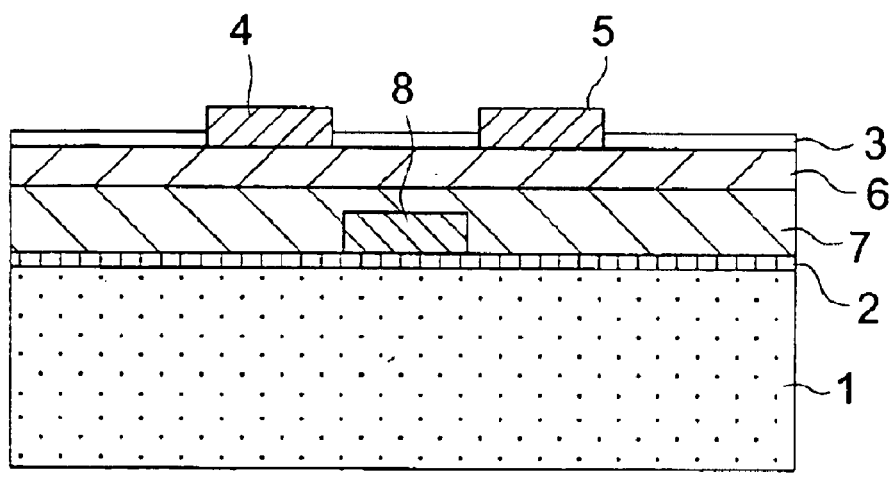

FIG. 2 is a structural example of the organic thin-film transistor of the invention (bottom gate type).

Figure 3:
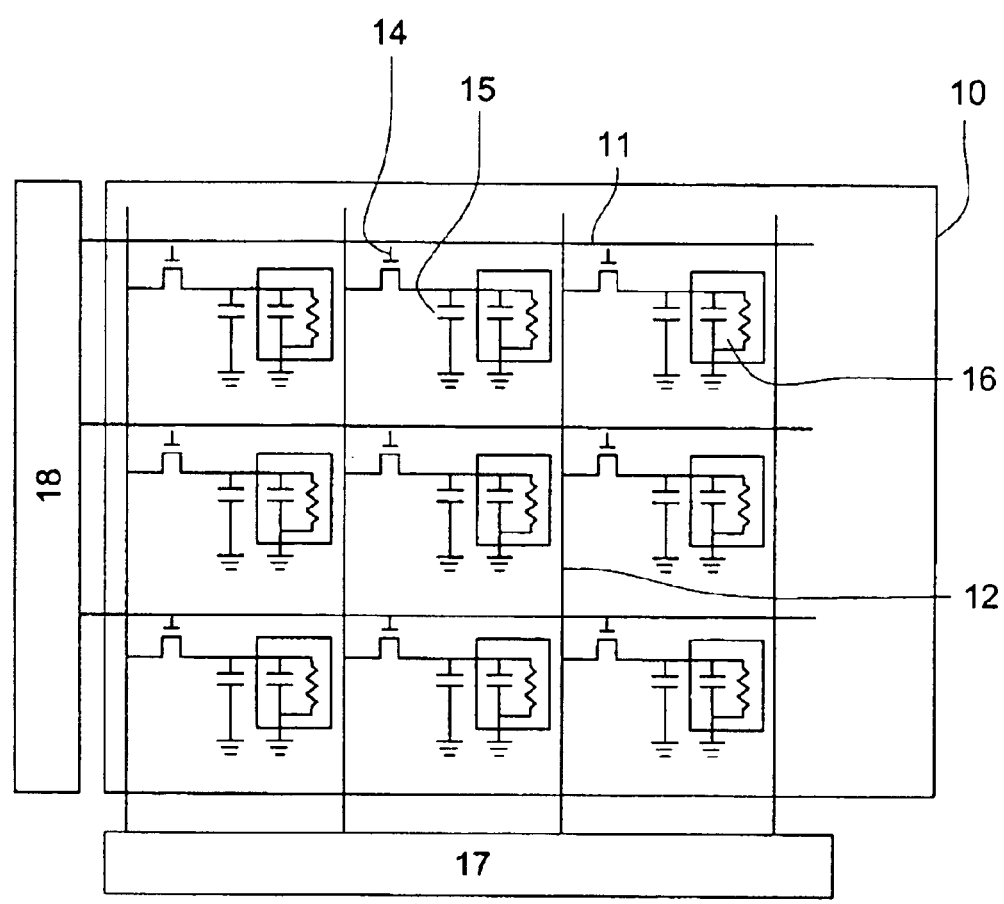

FIG. 3 is a schematic equivalent circuit diagram of one example of the organic thin-film transistor sheet of the invention.

FIGS. 4(1) through 4(8) are illustrations for explaining one embodiment of the organic thin-film transistor manufacturing method of the invention.

Figure 5:
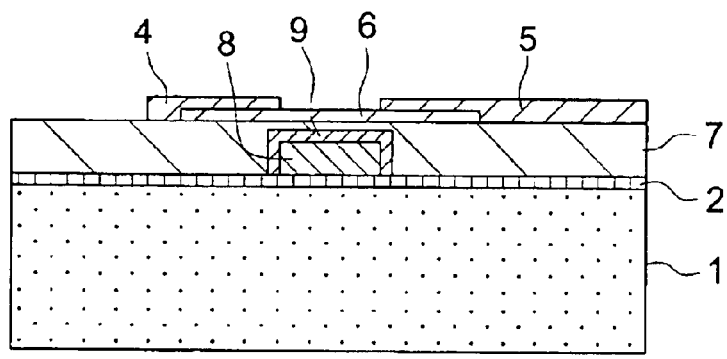

FIG. 5 is an illustration showing one structural example of a comparative organic thin-film transistor.

Figure 6:
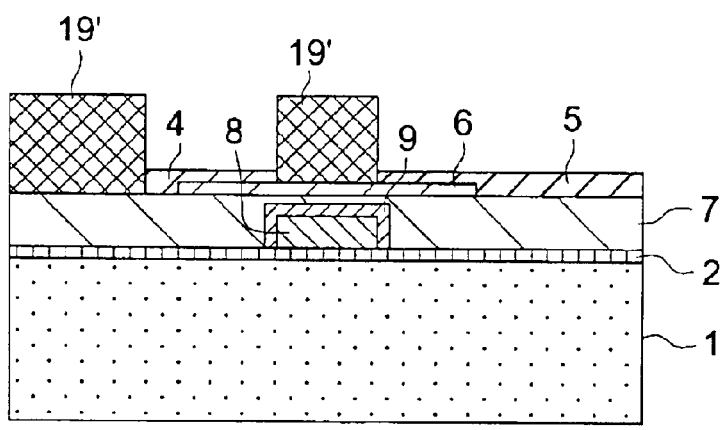

FIG. 6 is an illustration showing another structural example of a comparative organic thin-film transistor.

Figure 7:
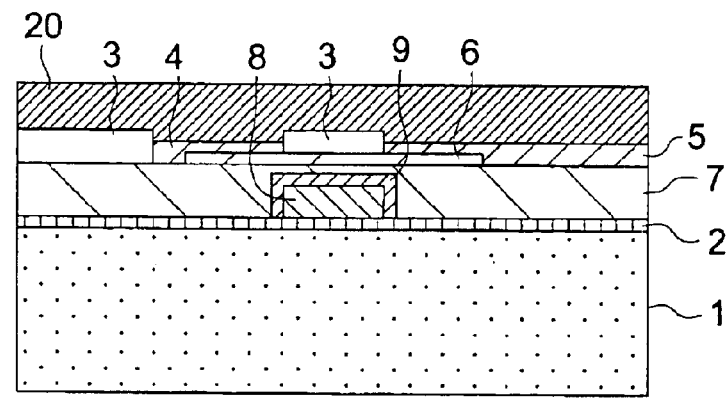

FIG. 7 is an illustration showing one structural example of an inventive organic thin-film transistor.

Figure 8:
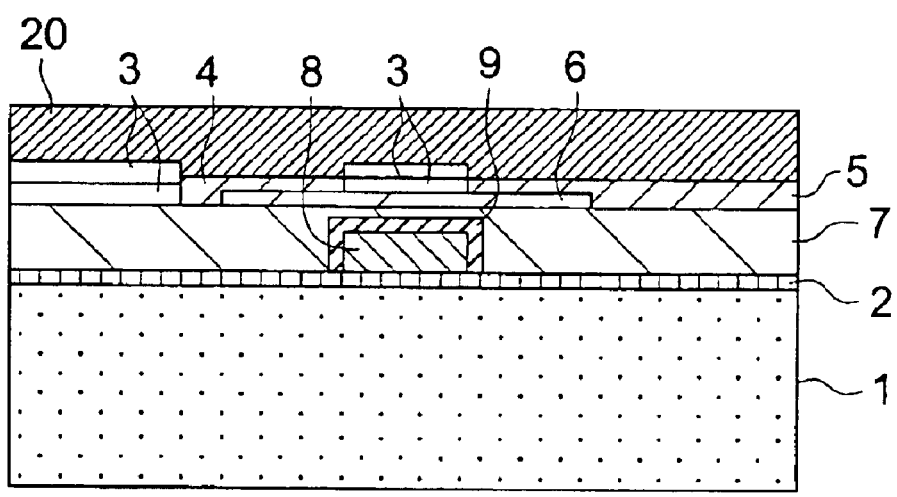

FIG. 8 is an illustration showing another structural example of an inventive organic thin-film transistor.

FIGS. 9(1) through 9(3) are illustrations for explaining another embodiment of the organic thin-film transistor manufacturing method of the invention.

Figure 10:
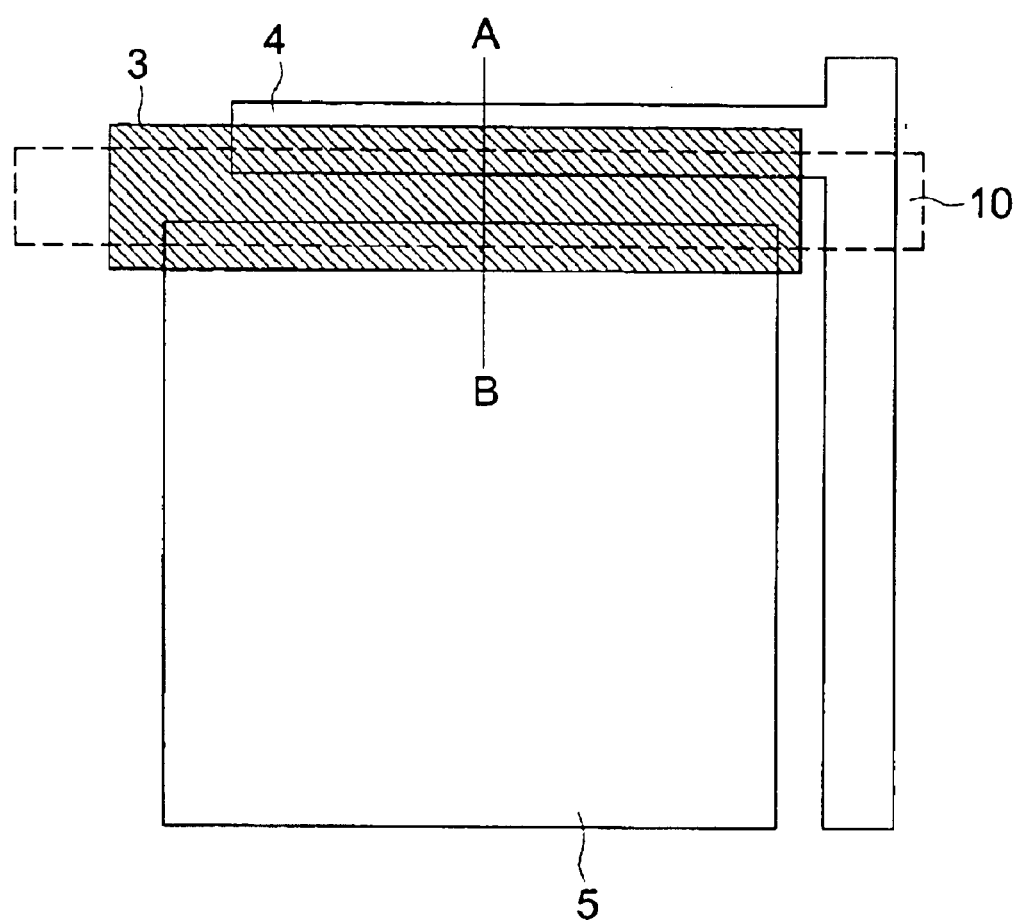

FIG. 10 is an illustration of an inventive organic thin-film transistor.

DETAILED DESCRIPTION OF THE INVENTION

The above object of the invention can be attained by the following constitution:

1. An organic thin-film transistor manufacturing method comprising the steps of a) forming a gate electrode on a substrate, b) forming a gate insulating layer on the substrate, c) forming an organic semiconductor layer on the substrate, d) forming an organic semiconductor layer protective layer on the organic semiconductor layer, e) removing a part of the organic semiconductor layer protective layer, and f) forming a source electrode and a drain electrode at portions where the organic semiconductor layer protective layer has been removed, so that the source electrode and drain electrode contacts the organic semiconductor layer.

2. The organic thin-film transistor manufacturing method of item 1, wherein the organic semiconductor layer protective layer is formed so as to contact the organic semiconductor layer.

3. The organic thin-film transistor manufacturing method of item 1, between the steps d) and e), further comprising the steps of g) forming a light sensitive resin layer contacting the organic semiconductor layer protective layer, h) exposing the light sensitive layer, and i) developing the exposed light sensitive layer with a developer.

4. The organic thin-film transistor manufacturing method of item 3, wherein the steps e) and i) are simultaneously carried out.

5. The organic thin-film transistor manufacturing method of item 3, wherein the developer is an aqueous alkali solution.

6. The organic thin-film transistor manufacturing method of item 1, wherein the layer formed on the organic semiconductor layer has a light transmittance of not more than 10%.

7. The organic thin-film transistor manufacturing method of item 3, wherein the light sensitive layer has a light transmittance of not more than 10%.

8. The organic thin-film transistor manufacturing method of item 6, wherein the organic semiconductor layer protective layer has a light transmittance of not more than 10%.

9. The organic thin-film transistor manufacturing method of item 1, wherein the organic semiconductor layer protective layer contains a hydrophilic polymer.

10. The organic thin-film transistor manufacturing method of item 1, wherein the organic semiconductor layer protective layer is formed by coating an aqueous hydrophilic polymer solution or an aqueous hydrophilic polymer dispersion.

11. The organic thin-film transistor manufacturing method of item 1, wherein the organic semiconductor layer protective layer contains inorganic oxides or inorganic nitrides.

12. The organic thin-film transistor manufacturing method of item 1, wherein the source electrode is formed from a conductive paste containing metal particles, a conductive ink or a metal film precursor.

13. The organic thin-film transistor manufacturing method of item 1, wherein the drain electrode is formed from a conductive paste containing metal particles, a conductive ink or a metal film precursor.

14. The organic thin-film transistor manufacturing method of item 1, wherein the source electrode contains a conductive polymer.

15. The organic thin-film transistor manufacturing method of item 1, wherein the drain electrode contains a conductive polymer.

16. The organic thin-film transistor manufacturing method of item 1, wherein the substrate is comprised of a resin.

17. An organic thin-film transistor comprising a substrate, a gate electrode formed on the substrate, a gate insulating layer formed on the substrate, an organic semiconductor layer formed on the substrate, an organic semiconductor layer protective layer with a through hole formed on the organic semiconductor layer, a source electrode and a drain electrode, each electrode being provided so as to contact the organic semiconductor layer through the through hole.

18. The organic thin-film transistor of item 17, wherein the organic semiconductor layer protective layer is formed so as to contact the organic semiconductor layer.

19. The organic thin-film transistor of item 17, wherein at least a part of the source electrode and at least a part of the drain electrode exist in the through hole.

20. The organic thin-film transistor of item 17, wherein the through hole has a first hole and a second hole each separated, the source electrode being provided so as to contact the organic semiconductor layer through the first hole, and the drain electrode being provided so as to contact the organic semiconductor layer through the second hole.

21. The organic thin-film transistor of item 17, wherein the layer formed on the organic semiconductor layer has a light transmittance of not more than 10%.

22. The organic thin-film transistor of item 21, wherein the organic semiconductor layer has a light transmittance of not more than 10%.

23. The organic thin-film transistor of item 17, wherein the organic semiconductor layer protective layer contains a hydrophilic polymer.

24. The organic thin-film transistor of item 17, wherein the organic semiconductor layer protective layer is formed by coating an aqueous hydrophilic polymer solution or an aqueous hydrophilic polymer dispersion.

25. The organic thin-film transistor of item 17, wherein the organic semiconductor layer protective layer contains inorganic oxides or inorganic nitrides.

26. The organic thin-film transistor of item 17, wherein the source electrode is formed from a conductive paste containing metal particles, a conductive ink or a metal film precursor.

27. The organic thin-film transistor of item 17, wherein the drain electrode is formed from a conductive paste containing metal particles, a conductive ink or a metal film precursor.

28. The organic thin-film transistor of item 17, wherein the source electrode contains a conductive polymer.

29. The organic thin-film transistor of item 17, wherein the drain electrode contains a conductive polymer.

30. The organic thin-film transistor of item 17, wherein the substrate is comprised of a resin.

31. An organic thin-film transistor sheet comprising two or more of the organic thin-film transistor of any one of items 17 through 30.

1-1. An organic thin-film transistor manufacturing method comprising the steps of a) forming a gate electrode on a substrate, b) forming a gate insulating layer on the substrate, c) forming an organic semiconductor layer on the substrate, d) forming an organic semiconductor layer protective layer on the organic semiconductor layer, e) removing a part of the organic semiconductor layer protective layer, and f) forming a source electrode and a drain electrode at portions where the organic semiconductor layer protective layer has been removed, so that the source electrode and drain electrode contacts the organic semiconductor layer.

1-2. The organic thin-film transistor manufacturing method of item 1-1, wherein the organic semiconductor layer protective layer is formed so as to contact the organic semiconductor layer.

1-3. The organic thin-film transistor manufacturing method of item 1-1 or 1-2, between the steps d) and e), further comprising the steps of g) forming a light sensitive resin layer contacting the organic semiconductor layer protective layer, h) exposing the light sensitive layer, and i) developing the exposed light sensitive layer with a developer.

1-4. The organic thin-film transistor manufacturing method of item 1-3, wherein the steps e) and i) are simultaneously carried out.

1-5. The organic thin-film transistor manufacturing method of item 1-3 or 1-4, wherein the developer is an aqueous alkali solution.

1-6. The organic thin-film transistor manufacturing method of any one of items 1-1 through 1-5, wherein the layer formed on the organic semiconductor layer has a light transmittance of not more than 10%.

1-7. The organic thin-film transistor manufacturing method of item 1-3, wherein the light sensitive layer has a light transmittance of not more than 10%.

1-8. The organic thin-film transistor manufacturing method of item 1-6 or 1-7, wherein the organic semiconductor layer protective layer has a light transmittance of not more than 10%.

1-9. The organic thin-film transistor manufacturing method of any one of items 1-1 through 1-7, wherein the organic semiconductor layer protective layer contains a hydrophilic polymer.

1-10. The organic thin-film transistor manufacturing method of any one of items 1-1 through 1-8, wherein the organic semiconductor layer protective layer is formed by coating an aqueous hydrophilic polymer solution or an aqueous hydrophilic polymer dispersion.

1-11. The organic thin-film transistor manufacturing method of any one of items 1-1 through 1-10, wherein the organic semiconductor layer protective layer contains inorganic oxides or inorganic nitrides.

1-12. The organic thin-film transistor manufacturing method of any one of items 1-1 through 1-11, wherein the source electrode is formed from a conductive paste containing metal particles, a conductive ink or a metal film precursor.

1-13. The organic thin-film transistor manufacturing method of any one of items 1-1 through 1-12, wherein the drain electrode is formed from a conductive paste containing metal particles, a conductive ink or a metal film precursor.

1-14. The organic thin-film transistor manufacturing method of any one of items 1-1 through 1-13, wherein the source electrode contains a conductive polymer.

1-15. The organic thin-film transistor manufacturing method of any one of items 1-1 through 1-14, wherein the drain electrode contains a conductive polymer.

1-16. The organic thin-film transistor manufacturing method of any one of items 1-1 through 1-15, wherein the substrate is comprised of a resin.

1-17. An organic thin-film transistor comprising a substrate, a gate electrode formed on the substrate, a gate insulating layer formed on the substrate, an organic semiconductor layer formed on the substrate, an organic semiconductor layer protective layer with a through hole formed on the organic semiconductor layer, a source electrode and a drain electrode, each electrode being provided so as to contact the organic semiconductor layer through the through hole.

1-18. The organic thin-film transistor of item 1-17, wherein the organic semiconductor layer protective layer is formed so as to contact the organic semiconductor layer.

1-19. The organic thin-film transistor of item 1-17 or 1-18, wherein at least a part of the source electrode and at least a part of the drain electrode exist in the through hole.

1-20. The organic thin-film transistor of any one of items 1-17 through 1-19, wherein the through hole has a first hole and a second hole each separated, the source electrode being provided so as to contact the organic semiconductor layer through the first hole, and the drain electrode being provided so as to contact the organic semiconductor layer through the second hole.

1-21. The organic thin-film transistor of any one of items 1-17 through 1-20, wherein the layer formed on the organic semiconductor layer has a light transmittance of not more than 10%.

1-22. The organic thin-film transistor of item 1-21, wherein the organic semiconductor layer has a light transmittance of not more than 10%.

1-23. The organic thin-film transistor of any one of items 1-17 through 1-22, wherein the organic semiconductor layer protective layer contains a hydrophilic polymer.

1-24. The organic thin-film transistor of any one of items 1-17 through 1-23, wherein the organic semiconductor layer protective layer is formed by coating an aqueous hydrophilic polymer solution or an aqueous hydrophilic polymer dispersion.

1-25. The organic thin-film transistor of any one of items 1-17 through 1-24, wherein the organic semiconductor layer protective layer contains inorganic oxides or inorganic nitrides.

1-26. The organic thin-film transistor of any one of items 1-17 through 1-25, wherein the source electrode is formed from a conductive paste containing metal particles, a conductive ink or a metal film precursor.

1-27. The organic thin-film transistor of any one of items 1-17 through 1-26, wherein the drain electrode is formed from a conductive paste containing metal particles, a conductive ink or a metal film precursor.

1-28. The organic thin-film transistor of any one of items 1-17 through 1-27, wherein the source electrode contains a conductive polymer.

1-29. The organic thin-film transistor of any one of items 1-17 through 1-28, wherein the drain electrode contains a conductive polymer.

1-30. The organic thin-film transistor of any one of items 1-17 through 1-29, wherein the substrate is comprised of a resin.

1-31. An organic thin-film transistor sheet comprising two or more of the organic thin-film transistor of any one of items 1-17 through 1-30.

2-1. An organic thin-film transistor manufacturing method comprising the steps of forming a gate electrode on a substrate comprised of a resin, forming a gate insulating layer on the substrate, forming an organic semiconductor layer on the substrate, and forming a source layer and a drain electrode, wherein the method further comprises the steps of forming an organic semiconductor layer protective layer so as to contact the organic semiconductor layer, and removing the organic semiconductor layer protective layer at portions where the source electrode and the drain electrode are to be formed to reveal the organic semiconductor layer at that portions, and wherein the source electrode and the drain electrode are formed so as to contact the revealed organic semiconductor layer.

2-2. The organic thin-film transistor manufacturing method of item 2-1, further comprising the steps of forming a light sensitive resin layer so as to contact the organic semiconductor layer protective layer, exposing the light sensitive resin layer, developing the exposed light sensitive resin layer, and removing, during or after the development, the organic semiconductor layer protective layer at portions where the source electrode and the drain electrode are to be formed.

2-3. The organic thin-film transistor manufacturing method of item 2-2, wherein the developing is carried out employing an aqueous alkali solution.

2-4. The organic thin-film transistor manufacturing method of item 2-2 or 2-3, wherein the light sensitive resin layer has a light transmittance of not more than 10%.

2-5. The organic thin-film transistor manufacturing method of any one of claims 2-1 through 2-4, wherein the organic semiconductor layer protective layer has a light transmittance of not more than 10%.

2-6. The organic thin-film transistor manufacturing method of any one of items 2-1 through 2-5, wherein the organic semiconductor layer protective layer contains a hydrophilic polymer.

2-7. The organic thin-film transistor manufacturing method of any one of items 2-1 through 2-5, wherein the organic semiconductor layer protective layer is formed from an aqueous hydrophilic polymer solution or an aqueous hydrophilic polymer dispersion.

2-8. The organic thin-film transistor manufacturing method of any one of items 2-1 through 2-6, wherein the organic semiconductor layer protective layer contains inorganic oxides or inorganic nitrides.

2-9. The organic thin-film transistor manufacturing method of any one of items 2-1 through 2-8, wherein the source electrode or drain electrode is formed from a conductive paste containing metal particles, a conductive ink or a metal film precursor.

2-10. The organic thin-film transistor manufacturing method of any one of items 2-1 through 2-8, wherein the source electrode or drain electrode contains a conductive polymer.

2-11. An organic thin-film transistor manufactured by the organic thin-film transistor manufacturing method of any one of items 2-1 through 2-10.

2-12. An organic thin-film transistor comprising a substrate of a resin, and provided thereon, a gate electrode, a gate insulating layer, an organic semiconductor layer having a through hole, a source electrode and a drain electrode, wherein an organic semiconductor layer protective layer is provided so as to contact the organic semiconductor layer, and the source electrode and drain electrode both contact the organic semiconductor layer through the through hole.

2-13. The organic thin-film transistor of item 2-12, wherein the layer provided on the organic semiconductor layer has a light transmittance of not more than 10%.

2-14. The organic thin-film transistor of item 2-12 or 2-13, wherein the organic semiconductor layer protective layer has a light transmittance of not more than 10%.

2-15. The organic thin-film transistor of any one of items 2-12 through 2-14, wherein the organic semiconductor layer protective layer contains a hydrophilic polymer.

2-16. The organic thin-film transistor of any one of items 2-12 through 2-15, wherein the organic semiconductor layer protective layer is formed by coating an aqueous hydrophilic polymer solution or an aqueous hydrophilic polymer dispersion.

2-17. The organic thin-film transistor of any one of items 2-12 through 2-16, wherein the organic semiconductor layer protective layer contains inorganic oxides or inorganic nitrides.

2-18. The organic thin-film transistor of any one of items 2-12 through 2-17, wherein the source electrode or the drain electrode is formed from a conductive paste containing metal particles, a conductive ink or a metal film precursor.

2-19. The organic thin-film transistor of any one of items 2-12 through 2-17, wherein the source electrode or the drain electrode contains a conductive polymer.

2-20. An organic thin-film transistor sheet comprising two or more of the organic thin-film transistor of any one of items 2-11 through 2-19.

[Embodiment of the Invention]

Embodiment of the invention will be explained below, employing Figures.

As the organic thin-film transistor of the invention, there are a top gate type transistor which comprises a substrate of a resin, an organic semiconductor layer on the substrate, the organic semiconductor layer contacting a source electrode and a drain electrode, a gate insulating layer on the organic semiconductor layer, and a gate electrode on the gate insulating layer, and a bottom gate type transistor which comprises a substrate of a resin, a gate electrode on the substrate, an organic semiconductor layer on the substrate, the organic semiconductor layer contacting a source electrode and a drain electrode, a gate insulating layer on the organic semiconductor layer, and a gate electrode on the gate insulating layer.

The structural examples thereof will be shown in FIG. 1 and 2.

FIG. 1 is a structural example of the top gate type transistor.

In FIG. 1, a subbing layer 2, containing a compound selected from polymers, inorganic oxides, and inorganic nitrides, is provided on a substrate 1 comprised of a resin. An organic semiconductor layer 6 is provided on the subbing layer 2, and an organic semiconductor layer protective layer 3 having through holes is provided on the organic semiconductor layer 6. A drain electrode 4 and a source electrode 5 are provided so that both contact the organic semiconductor layer 6 through the through holes of the organic semiconductor layer protective layer 3. A gate insulating layer 7 is provided on the drain electrode 4, source electrode 5, and the organic semiconductor layer protective layer 3, and a gate electrode 8 is provided on the gate insulating layer 7.

FIG. 2 is a structural example of the bottom gate type transistor.

In FIG. 2, a subbing layer 2, containing a compound selected from polymers, inorganic oxides, and inorganic nitrides, is provided on a substrate 1 comprised of a resin. A gate electrode 8 and a gate insulating layer 7 are provided on the subbing layer 2. An organic semiconductor layer 6 is provided on the gate insulating layer 7. An organic semiconductor layer protective layer 3 having through holes is provided on the organic semiconductor layer 6. A drain electrode 4 and a source electrode 5 are provided so that both contact the organic semiconductor layer 6 through the through holes of the organic semiconductor layer protective layer 3.

The organic thin-film transistor manufacturing method of the invention comprises the steps of a) forming a gate electrode on a substrate, b) forming a gate insulating layer on the substrate, c) forming an organic semiconductor layer on the substrate, d) forming an organic semiconductor layer protective layer on the organic semiconductor layer, e) removing a part of the organic semiconductor layer protective layer, and f) forming a source electrode and a drain electrode at portions where the organic semiconductor layer protective layer has been removed, so that the source electrode and drain electrode contacts the organic semiconductor layer. In the above method, the order of the steps a), b) and c) is free. For example, after the steps c) through f) has been carried out, the steps a) and b) are carried out.

The organic thin-film transistor of the invention comprises a substrate, a gate electrode on a substrate, a gate insulating layer formed on the substrate, an organic semiconductor layer formed on the substrate, an organic semiconductor layer protective layer with a through hole formed on the organic semiconductor layer, a source electrode and a drain electrode, each electrode being provided so as to contact the organic semiconductor layer through the through hole. In the above organic thin-film transistor, the gate electrode may be located at the position farther from the substrate or at the position closer to the substrate than the source electrode and the drain electrode.

In the organic thin-film transistor of the invention, the organic semiconductor layer protective layer preferably contacts the organic semiconductor layer. Such an organic semiconductor layer protective layer, contacting the organic semiconductor layer, can prevent deterioration of the organic semiconductor layer due to air or a solvent for coating used in the manufacture, and can prevent deterioration of performance as a transistor. Further, the organic semiconductor layer protective layer can provide excellent resistance to folding, whereby deterioration due to folding of performance as a transistor can be minimized.

As a material of the organic semiconductor layer protective layer, a material is used which has no influence on the organic semiconductor layer during or after manufacture of an organic thin-film transistor. When a light sensitive composition such as a light sensitive resin layer is coated on the organic semiconductor layer protective layer, a material is used which is not affected by the light sensitive composition during coating. Further, the material is preferred a material which is not affected during processing of the light sensitive resin layer. Such a material is preferably a material containing a hydrophilic polymer, and more preferably an aqueous hydrophilic polymer solution or an aqueous hydrophilic polymer dispersion. The hydrophilic polymer hereinafter referred to is a polymer soluble or dispersible in water, an aqueous acidic or alkali solution, or an aqueous solution of various surfactants. Examples of the hydrophilic polymer include polyvinyl alcohol, a homopolymer or copolymer of HEMA, acrylic acid, or acryl amide. A material containing inorganic oxides or inorganic nitrides is also preferred, since it has no influence on the organic semiconductor layer and is not influenced during coating of another layer. Further, a material to be used in a gate insulating layer described later can be also used. Preferred examples of the inorganic oxides include silicon oxide, aluminum oxide, tantalum oxide, titanium oxide, tin oxide, vanadium oxide, barium strontium titanate, barium zirconate titanate, zirconic acid lead carbonate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. Preferred examples of the inorganic nitrides include silicon nitride and aluminum nitride. The organic semiconductor layer protective layer in the invention is preferably formed according to a coating method, and more preferably formed by coating the aqueous hydrophilic polymer solution or the aqueous hydrophilic polymer dispersion.

The organic semiconductor layer protective layer containing inorganic oxides or inorganic nitrides is preferably formed according to an atmospheric pressure plasma method.

The plasma layer formation method at atmospheric pressure means a method wherein a reactive gas is plasma-excited by discharge conducted at atmospheric pressure or at approximately atmospheric pressure, whereby a thin-film is formed on a substrate. The method (hereinafter referred to also as an atmospheric pressure plasma method) is described in Japanese Patent O.P.I. Publication Nos. 11-61406, 11-133205, 2000-121804, 2000-147209, and 2000-185362. This method can form a thin film having high performance at high productivity.

In the invention, the organic semiconductor layer protective layer has a light transmittance of preferably not more than 10%, and more preferably not more than 1%. This can prevent deterioration due to light of the organic semiconductor layer.

In the invention, light transmittance shows an average light transmittance of light having a wavelength capable of generating a light generating carrier in the organic semiconductor layer. Generally, a light with a wavelength from 350 to 750 nm is preferably shielded.

In the invention, arrival of light at the organic semiconductor layer should be prevented in order to minimize deterioration due to light of the organic semiconductor layer. Accordingly, the light arrival may be reduced not only by the organic semiconductor layer protective layer but also by another layer, provided on the organic semiconductor layer (all layers in the case of multi-layers), each having a light transmittance of not more than 10%, and more preferably not more than 1%. The thickness of the organic semiconductor layer protective layer is preferably 0.01 to 10 $\mu$m. This thickness range can provide a good protective property, and a source electrode and a drain electrode with good resolution.

In order to reduce light transmittance of the layer, the layer can contain colorants such as pigments and dyes, or UV absorbing agents.

The organic thin-film transistor of the invention comprises an organic semiconductor layer protective layer having through holes which is provided on an organic semiconductor layer, and a source electrode and a drain electrode both contacting the organic semiconductor layer through the through holes. The protective layer protects the organic semiconductor layer during the manufacture of the organic thin-film transistor, and can minimize contact of the organic semiconductor layer with air or a coating solvent during formation of the source and drain electrodes, whereby deterioration of performance of the transistor can be minimized.

The organic thin-film transistor of the invention comprises a subbing layer containing a compound selected from inorganic oxides or inorganic nitrides or a subbing layer containing a polymer.

The inorganic oxides contained in the subbing layer include silicon oxide, aluminum oxide, tantalum oxide, titanium oxide, tin oxide, vanadium oxide, barium strontium titanate, barium zirconate titanate, zirconic acid lead carbonate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. The inorganic nitrides include silicon nitride and aluminum nitride.

Of these, silicon oxide, aluminum oxide, tantalum oxide, titanium oxide or silicon nitride is preferred.

In the invention, the subbing layer containing a compound selected from inorganic oxides or inorganic nitrides is preferably formed according to the atmospheric pressure plasma method described above.

Examples of the polymer used in the subbing layer include a polyester resin, a polycarbonate resin, a cellulose resin, an acryl resin, a polyurethane resin, a polyethylene resin, a polypropylene resin, a polystyrene resin, a phenoxy resin, a norbornene resin, an epoxy resin, vinyl chloride-vinyl acetate copolymer, a vinyl chloride resin, vinyl acetate-vinyl alcohol copolymer, a partially saponificated vinyl chloride-vinyl acetate copolymer, vinyl chloride-vinylidene chloride copolymer, vinyl chloride-acrylonitrile copolymer, ethylene-vinyl alcohol copolymer, polyvinyl alcohol, chlorinated polyvinyl chloride, ethylene-vinyl chloride copolymer, ethylene-vinyl acetate copolymer, a polyamide resin, an ethylene-butadiene resin, a butadiene-acrylonitrile resin, a silicone resin, and a fluorine-contained resin.

As organic semi-conductive materials for the organic semiconductor layer of the organic thin-film transistor of the invention, π-conjugated materials are used. Examples of the π-conjugated materials include polypyrroles such as polypyrrole, poly(N-substituted pyrrole), poly(3-substituted pyrrole), and poly(3,4-disubstituted pyrrole); polythiophenes such as polythiophene, poly(3-substituted thiophene), poly(3,4-disubstituted thiophene), and polybenzothiophene; polyisothianaphthenes such as polyisothianaphthene; polythienylenevinylenes such as polythienylenevinylene; poly(p-phenylenevinylenes) such as poly (p-phenylenevinylene); polyanilines such as polyaniline, poly(N-substituted aniline), poly(3-substituted aniline), and poly(2,3-substituted aniline); polyacetylnenes such as polyacetylene; polydiacetylens such as polydiacetylene; polyazulenes such as polyazulene; polypyrenes such as polypyrene; polycarbazoles such as polycarbazole and poly(N-substituted carbazole), polyselenophenes such as polyselenophene; polyfurans such as polyfuran and polybenzofuran; poly(p-phenylenes) such as poly(p-phenylene); polyindoles such as polyindole; polypyridazines such as polypyridazine; polyacenes such as naphthacene, pentacene, hexacene, heptacene, dibenzopentacene, tertabenzopentacene, pyrene, dibenzopyrene, chrysene, perylene, coronene, terylene, ovalene, quoterylene, and circumanthracene; derivatives (such as triphenodioxazine, triphenodithiazine, hexacene-6,15-quinone) in which some of carbon atoms of polyacenes are substituted with atoms such as N, S, and O or with a functional group such as a carbonyl group; polymers such as polyvinyl carbazoles, polyphenylene sulfide, and polyvinylene sulfide; and polycyclic condensation products described in Japanese Patent O.P.I. Publication No. 11-195790.

Further, oligomers having repeating units in the same manner as in the above polymers, for example, thiophene hexamers including α-sexithiophene, α,ω-dihexyl-α-sexithiophene, α,ω-dihexyl-α-quiinquethiophene, and α,ω-bis(3-butoxypropyl)-α-sexithiophene, or styrylbenzene derivatives, can be suitably employed.

Further, listed are metallophthalocyanines such as copper phthalocyanine, and fluorine-substituted copper phthalocyanines described in Japanese Patent O.P.I. Publication No. 11-251601; tetracarboxylic acid diimides of condensed ring compounds including naphthalene tetracarboxylic acid imides such as naphthalene 1,4,5,8-teracarboxylic acid diimide, N,N'-bis(4-trifluoromethylbenzyl)naphthalene 1,4,5,8-tretracarboxylic acid diimide, N,N'-bis(1H,1H-perfluoroctyl)naphthalene 1,4,5,8-tetracarboxylic acid diimide derivatives, N,N'-bis(1H,1H-perfluorobutyl)naphthalene 1,4,5,8-tetracarboxylic acid diimide derivatives, N,N'-dioctylnaphthalene 1,4,5,8-tetracarboxylic acid diimide derivatives, and naphthalene 2,3,6,7-tetracarboxylic acid diimides, and anthracene tetracarbocylic acid diimides such as anthracene 2,3,6,7-tetracarboxylic acid diimides; fullerenes such as $C_{60}$, $C_{70}$, $C_{76}$, $C_{78}$, and $C_{84}$; carbon nanotubes such as SWNT; and dyes such as merocyanines and hemicyanines.

Of these π conjugated compounds, preferably employed is at least one selected from the group consisting of oligomers which have thiophene, vinylene, thienylenevinylene, phenylenevinylene, p-phenylene, their substitution product or at least two kinds thereof as a repeating unit and have a repeating unit number n of from 4 to 10, polymers which have the same unit as above and a repeating unit number n of at least 20, condensed polycyclic aromatic compounds such as pentacene, fullerenes, condensed cyclic tetracarboxylic acid diimides of condensed ring compounds, and metallo-phthalocyanines.

Further, employed as other materials for organic semiconductors may be organic molecular complexes such as a tetrathiafulvalene (TTF)-tetracyanoquinodimethane (TCNQ) complex, a bisethylenetetrathiafulvalene (BEDTTTF)-perchloric acid complex, a BEDTTTF-iodine complex, and a TCNQ-iodine complex. Still further, employed may be a conjugated polymers such as polysilane and polygermane, as well as organic-inorganic composite materials described in Japanese Patent O.P.I. Publication No. 2000-260999.

In the invention, the organic semiconductor layer may be subjected to a so-called doping treatment (referred to also as simply doping) by incorporating in the layer, materials working as an acceptor which accepts electrons, for example, acrylic acid, acetamide, materials having a functional group such as a dimethylamino group, a cyano group, a carboxyl group and a nitro group, benzoquinone derivatives, or tetracyanoethylene, tetracyanoquinodimethane or their derivatives, or materials working as a donor which donates electrons, for example, materials having a functional group such as an amino group, a triphenyl group, an alkyl group, a hydroxyl group, an alkoxy group, and a phenyl group; substituted amines such as phenylenediamine; anthracene, benzoanthracene, substituted benzoanthracenes, pyrene, substituted pyrene, carbazole and its derivatives, and tetrathiafulvalene and its derivatives.

The doping herein means that an electron accepting molecule (acceptor) or an electron donating molecule (donor) is incorporated in the organic semiconductor layer as a dopant. Accordingly, the layer, which has been subjected to doping, is one which comprises the condensed polycyclic aromatic compounds and the dopant. Employed as the dopant used in the present invention may be either acceptor or donor.

The methods for forming the organic semiconductor layer include a vacuum deposition method, a molecular beam epitaxial growth method, an ion cluster beam method, a low energy ion beam method, an ion plating method, a CVD method, a sputtering method, a plasma polymerization method, an electrolytic polymerization method, a chemical polymerization method, a spray coating method, a spin coating method, a blade coating method, a dip coating method, a casting method, a roll coating method, an bar coating method, a die coating method, and an LB method. These methods may be used according to kinds of materials used. However, of these, a spin coating method, a blade coating method, a dip coating method, a roll coating method, a bar coating method, and a die coating method are preferred from the viewpoint of productive efficiency.

When a precursor such as pentacene is soluble in a solvent as disclosed in Advanced Material 1999, Vol. 6, p. 480–483, a precursor layer formed by coating of the precursor solution may be heat treated to form an intended organic material layer.

The thickness of the organic semiconductor layer is not specifically limited. The thickness of an organic semiconductor layer comprised of the organic semiconductor materials often has a great influence on properties of the resultant transistor. Accordingly, the thickness of the layer differs due to kinds of the organic semiconductor materials used, but it is ordinarily not more than 1 μm, and preferably from 10 to 300 nm.

In the organic thin-film transistor of the invention, materials for constituting a gate electrode, a source electrode, and a drain electrode are not particularly restricted as long as they are electrically conductive materials. Employed as the materials are platinum, gold, silver, nickel, chromium, copper, iron, tin, antimony, lead, tantalum, indium, palladium, tellurium, rhenium, iridium, aluminum, ruthenium, germanium, molybdenum, tungsten, tin oxide-antimony, indium oxide-tin (ITO), fluorine-doped zinc oxide, zinc, carbon, graphite, glassy carbon, silver paste as well as carbon paste, lithium, beryllium, sodium, magnesium, potassium, calcium, scandium, titanium, manganese, zirconium, gallium, niobium, sodium, sodium-potassium alloy, magnesium, lithium, aluminum, magnesium/copper mixtures, magnesium/silver mixtures, magnesium/aluminum mixtures, magnesium/indium mixtures, aluminum/aluminum oxide mixtures, and lithium/aluminum mixtures. As materials for the above electrodes, electrically conductive polymers known in the art, which increase electrical conductivity upon being doped, are preferably employed. Examples thereof include electrically conductive polyaniline, electrically conductive polypyrrole, electrically conductive polythiophene, and a complex of polyethylenedioxythiophene and polystyrene sulfonic acid. The source and drain electrodes are those providing less electrical resistance at an interface between the electrodes and the semiconductor layer, and are preferably electrodes comprised of a conductive polymer, platinum, gold, silver, or ITO in p-type semiconductor.

In the invention, the source electrode and drain electrode are preferably electrodes formed from a flowable electrode material such as a solution, paste, ink, or a dispersion solution containing the above electrically conductive material, and more preferably electrodes formed from a flowable electrode material containing a conductive polymer, platinum, gold, silver, or copper. As a solvent or a dispersion medium, a solvent or dispersion medium containing water in an amount of not less than 60%, and more preferably not less than 90% is preferred in that damage to the organic semiconductor is reduced.

As a metal particle-containing flowable electrode material, a known conductive paste can be used. The metal particle-containing dispersion is preferably a dispersion in which metal particles with a particle size of from 1 to 50 nm, and preferably from 1 to 10 nm, and optionally a dispersion stabilizer are dispersed in water or an appropriate solvent.

Materials for the metal particles include platinum, gold, silver, nickel, chromium, copper, iron, tin, antimony, lead, tantalum, indium, palladium, tellurium, rhenium, iridium, aluminum, ruthenium, germanium, molybdenum, tungsten, and zinc.

An electrode is preferably formed from a metal particle dispersion in which metal particles of these metals are dispersed in a dispersion medium such as water or an organic solvent in the presence of an organic dispersion stabilizer Methods for preparing such a metal particle dispersion include a physical preparation method such as a gas vaporization method, a sputtering method, or a metallic vapor preparation method and a chemical preparation method such as a colloid method or a co-precipitation method in which metal ions are reduced in a liquid phase to produce metal particles. The metal particles dispersion are preferably ones prepared according to a colloid method disclosed in Japanese Patent O.P.I. Publication Nos. 11-76800, 11-80647, 11-319538, and 2000-239853, or ones prepared according to a gas vaporization method disclosed in Japanese Patent O.P.I. Publication Nos. 2001-254185, 2001-53028, 2001-35814, 2001-35255, 2001-124157 and 2000-123634. An electrode pattern is formed from these metal particle dispersions dried, and optionally subjected to heat treatment at from 100 to 300° C., and preferably from 150 to 200° C, whereby the metal particles are heat-fused to form an electrode in an intended form.

Methods for forming the electrode include a method in which a photolithographic method or a lift-off method, known in the art, is applied to an electrically conductive layer of the materials described above, which has been formed employing a vacuum deposition method or a sputtering method, and a method in which a resist layer is subjected to etching which has been prepared employing thermal transfer or ink jet printing onto a foil of metal such as aluminum or copper. Further, an electrically conductive polymer solution or dispersion, or a minute electrically conductive particle dispersion may be subjected directly to patterning, employing ink jet printing to obtain an electrode. An electrode may also be formed in such a manner that a coated layer is subjected to lithography or laser ablation. In addition, a method may also be employed in which ink comprising either an electrically conductive polymer or minute electrically conductive particles, or electrically conductive paste is subjected to patterning, employing any of the printing methods such as letter press, intaglio printing, lithography, or screen printing.

In the organic thin-film transistor of the invention, the source and drain electrodes are preferably formed according to photolithography, wherein a light sensitive resin solution is coated on the entire surface of the organic semiconductor layer protective layer to form a light sensitive resin layer.

As a material for the light sensitive resin layer, a well-known positive working or negative working material can be used, but a laser sensitive material is preferably used. As such a material for the photoresist, there are (1) a dye sensitized photo-polymerizable light-sensitive material disclosed in Japanese Patent O.P.I. Publication Nos. 11-271969, 2001-117219, 11-311859, and 11-352691, (2) an infrared laser-sensitive negative working material disclosed in Japanese Patent O.P.I. Publication No. 9-179292, U.S. Pat. No. 5,340,699, and Japanese Patent O.P.I. Publication Nos. 10-90885, 2000-321780, and 2001-154374, and (3) an infrared laser-sensitive positive working material in Japanese Patent O.P.I. Publication Nos. 9-171254, 5-115144, 10-87733, 9-43847, 10-268512, 11-194504, 11-223936, 11-84675, 11-174681, 7-282575, and 2000-56452, WO97/39894, and WO98/42507. The material of item (2) or (3) above is preferred in that its use is not limited to use in the dark.

In the photolithography, after the above, an electrode pattern is formed from a metal particle dispersion or an electrically conductive polymer as a material for the source and drain, and optionally heat fused, whereby the source or drain electrode can be easily and precisely formed. The above method can easily form various shapes, which makes it possible to easily produce an organic thin-film transistor.

Solvents for preparing a coating liquid of the light sensitive resin layer include propylene glycol monomethyl ether, propylene glycol monoethyl ether, methyl cellosolve, methyl cellosolve acetate, ethyl cellosolve, ethyl cellosolve acetate, dimethylformamide, dimethylsulfoxide, dioxane, acetone, cyclohexanone, trichloroethylene, and methyl ethyl ketone. These solvents may be used singly or as a mixture of two or more kinds thereof.

As a method for forming a light sensitive resin layer, there is a coating method such as a spray coating method, a spin coating method, a blade coating method, a dip coating method, a casting method, a roll coating method, a bar coating method or a die coating method.

In order to restrain arrival of light at the organic semiconductor layer to minimize deterioration due to light of the organic semiconductor layer, light transmittance of the light sensitive resin layer may be reduced by addition of colorants such as dyes or a UV absorbing agent, wherein light transmittance of the light sensitive resin layer is preferably not more than 10%, and more preferably not more than 1%.

The formed light sensitive resin layer is imagewise exposed. As a light source for the imagewise exposure, there are an argon laser, a semi-conductive laser, a He—Ne laser, a YAG laser, and a carbon dioxide gas laser, and a semi-conductive laser, which has an emission wavelength at the infrared wavelength regions, is preferred. The output power of the laser is suitably not less than 50 mW, and preferably not less than 100 mW.

Subsequently, the exposed light sensitive resin layer is subjected to development.

The developing solution for development of the light sensitive resin layer is suitably an aqueous alkali developing solution. Examples of the aqueous alkali developing solution include an aqueous solution of an alkali metal salt such as sodium hydroxide, potassium hydroxide, sodium carbonate, potassium carbonate, sodium metasilicate, potassium metasilicate, sodium secondary phosphate, or sodium tertiary phosphate, and an aqueous solution of an alkali compound such as ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, choline, pyrrole, piperidine, 1,3-diazabicyclo-[5,4,0]-7-undecane or 1,5-diazabicyclo-[4,3,0]-5-nonane. In the invention, the concentration of the alkali metal salt or the alkali compound in the aqueous alkali developing solution is ordinarily from 1 to 10% by weight, and preferably from 2 to 5% by weight.

The developing solution may optionally contain an anionic surfactant, an amphoteric surfactant or an organic solvent such as alcohol. Examples of the organic solvent include propylene glycol, ethylene glycol monophenyl ether, benzyl alcohol and n-propyl alcohol.

The step of removing the light sensitive resin layer may be optionally added. In the case where the residual light sensitive resin layer is removed after an electrode pattern is formed from the metal particle dispersion or the electrically conductive polymer, the light sensitive resin composition used is preferably a positive working one. The composition for forming the light sensitive resin layer preferably contains a phenol resin such as novolak resin or polyvinyl phenol. Examples of the novolak resin include phenol formaldehyde resin, cresol-formaldehyde resin, phenol-cresol-formaldehyde cocondensation resin disclosed in Japanese Patent O.P.I. Publication No. 55-57841, and a cocondensation resin of p-substituted phenol and phenol or cresol with formaldehyde disclosed in Japanese Patent O.P.I. Publication No. 55-127553. When the residual light sensitive resin layer is removed after an electrode pattern is formed from the metal particle dispersion or the electrically conductive polymer, the removing solvent is selected from the organic solvents such as an alcohol solvent, an ether solvent, an ester solvent, a ketone solvent, and a glycol ether solvent, which are used for preparing a coating liquid of the light-sensitive resin layer. The ether or ketone solvent is preferred in order to minimize an influence on the electrically conductive polymer layer, i.e., in order to minimize reduction of electric conductivity or increase a residual amount of the electrically conductive polymer layer. The ether solvent such as tetrahydrofuran (THF) is most preferred.

In the invention, an ablation layer can be used to form electrodes. The ablation layer in the invention contains an actinic light absorbing agent, a binder resin, and optionally various additives.

As the actinic light absorbing agent, there are various organic or inorganic materials capable of absorbing actinic light. For example, when infrared laser is used as actinic light, pigment absorbing infrared light, dyes, metals, metal oxides, metal nitrides, metal carbonates, metal borides, graphite, carbon black, titanium black, and ferromagnetic metal powder such as metal magnetic powder containing Al, Fe, Ni, or Co as a main component can be used. Among these, carbon black, dyes such as cyanine dyes and Fe containing ferromagnetic metal powder are preferred. The content of the actinic light absorbing agent in the ablation layer is from 30 to 95% by weight, and preferably from 40 to 80% by weight.

The binder resin used in the invention may be any resin as long as it can carry the actinic light absorbing agent described above. Examples of the binder resin include a polyurethane resin, a polyester resin, a vinyl chloride resin, a polyvinyl acetal resin, a cellulose resin, an acryl resin, a phenoxy resin, a polycarbonate resin, a polyamide resin, a phenol resin, and an epoxy resin. The content of the binder resin in the ablation layer is from 5 to 70% by weight, and preferably from 20 to 60% by weight.

In the invention, the ablation layer refers to a layer to be ablated by irradiation of a high density energy light. Herein, "ablated" refers to phenomenon in which an ablation layer is completely scattered or a part of the layer is destroyed and/or scattered by its physical or chemical change, or the physical or chemical change occurs only near the interface between the layer and its adjacent layer. In the invention, a resist can be formed employing this phenomenon, and then electrodes can be formed.

The high density energy light can be used without any special limitation as long as it is light capable of ablating an ablation layer on exposure. As an exposure method, flash exposure may be carried out through a photomask employing a xenon lamp, a halogen lamp or a mercury lamp, or scanning exposure may be carried out employing a convergent laser light. Infrared laser, particularly a semiconductor laser having an output power of from 20 to 200 mW per one beam is preferably used. The energy density used is preferably from 50 to 500 mJ/cm$^2$, and more preferably from 100 to 300 mJ/cm$^2$.

Various insulating layers may be employed as the gate insulating layer of the organic thin-film transistor of the invention. The insulating layer is preferably an inorganic oxide layer comprised of an inorganic oxide with high dielectric constant. Examples of the inorganic oxide include silicon oxide, aluminum oxide, tantalum oxide, titanium oxide, tin oxide, vanadium oxide, barium strontium titanate, barium zirconate titanate, zirconic acid lead carbonate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. Of these, silicon oxide, silicon nitride, aluminum oxide, tantalum oxide or titanium oxide is particularly preferred. An inorganic nitride such as silicon nitride or aluminum nitride can be also suitably used.

The methods for forming the above layer include a dry process such as a vacuum deposition method, a molecular beam epitaxial growth method, an ion cluster beam method, a low energy ion beam method, an ion plating method, a CVD method, a sputtering method, or an atmospheric pressure plasma method, a wet process such as a spray coating method, a spin coating method, a blade coating method, a dip coating method, a casting method, a roll coating method, an bar coating method, or a die coating method, and a patterning method such as a printing method or an ink-jet method. These methods can be used due to kinds of materials used in the insulating layer.

As the typical wet process can be used a method of coating a dispersion liquid and drying, the liquid being obtained by dispersing inorganic oxide particles in an organic solvent or water optionally in the presence of a dispersant such as a surfactant, or a so-called sol gel method of coating a solution of an oxide precursor such as an alkoxide and drying.

Among the above, the preferred is an atmospheric pressure plasma method.

It is preferred that the gate insulating layer is comprised of an anodization film or an anodization film and an insulating film. The anodization film is preferably subjected to sealing treatment. The anodization film is formed on a metal capable of being anodized by anodizing the metal according to a known method.

Examples of the metal capable of being anodized include aluminum and tantalum. An anodization treatment method is mot specifically limited and the known anodization treatment method can be used. Anodization treatment forms an anodization film. An electrolytic solution used in the anodization treatment may be any as long as it can form a porous oxidation film. Examples of electrolytes in the electrolytic solution include sulfuric acid, phosphoric acid, oxalic acid, chromic acid, boric acid, sulfamic acid, benzene sulfonic acid or their salt, and a mixture thereof. Anodization treatment conditions cannot be specified since they vary due to kinds of an electrolytic solution used. Generally, the concentration of the electrolytic solution is from 1 to 80% by weight, temperature of the electrolytic solution is from 5 to 70 C, electric current density is from 0.5 to 60 A/dm2, voltage applied is from 1 to 100 V, and electrolytic time is from 10 seconds to 5 minutes. It is preferred that an aqueous solution of sulfuric acid, phosphoric acid or boric acid is used as an electrolytic solution, and direct current is used. Alternating current can be also used. Anodization treatment is preferably carried out at an electric current density of from 0.5 to 20 A/dm2 at an electrolytic solution temperature of from 20 to 50 for 20 to 250 seconds.

Examples of the organic compound used in an organic compound layer include polyimide, polyamide, polyester, polyacrylate, a photo-curable resin such as a photo-radical polymerizable or photo-cation polymerizable resin, a copolymer containing an acrylonitrile unit, polyvinyl phenol, polyvinyl alcohol, novolak resin, and cyanoethylpullulan.

As a method of forming the organic compound layer, the wet process described above is preferably used.

An inorganic oxide layer and an organic oxide layer can be used in combination and superposed. The thickness of the insulating layer is generally 50 nm to 3 $\mu$m, and preferably from 100 nm to 1 $\mu$m.

An orientation layer may be provided between the gate insulating layer and the organic semiconductor layer. As the orientation layer, a self organization layer is preferably used which is formed from a silane coupling agent such as octadecyltrichlorosilane or trichloromethylsilane, alkane phosphoric acid, alkane sulfonic acid, or an alkane carboxylic acid.

In the invention, the substrate is comprised of a resin, and for example, it is possible to use a plastic film sheet. Examples of the plastic film include films comprised of, for example, polyethylene terephthalate (PET), polyethylene naphthalate (PEN), polyethersulfone (PES), polyetherimide, polyether ether ketone, polyphenylene sulfide, polyallylate, polyimide, polycarbonate (PC), cellulose triacetate (TAC), or cellulose acetate propionate (CAP). Use of the plastic film makes it possible to decrease weight, to enhance portability, and to enhance durability against impact due to its flexibility, as compared with glass.

In the invention, a transistor protective layer can be provided on the organic thin-film transistor of the invention. Materials for the transistor protective layer include inorganic oxides or nitrides described above, and the transistor protective layer is preferably formed according to the atmospheric pressure plasma method, whereby resistance of the organic thin-film transistor is improved.

Next, the manufacturing method of the organic thin-film transistor of the invention will be explained.

The manufacturing method of the organic thin-film transistor of the invention comprising a substrate comprised of a resin and provided thereon, a gate electrode, a gate insulating layer, an organic semiconductor layer, an organic semiconductor layer protective layer, a source electrode and a drain electrode, the method comprising the steps of forming a gate electrode; forming a gate insulating layer; forming an organic semiconductor layer; forming an organic semiconductor layer protective layer so that the organic semiconductor layer protective layer contacts the resulting organic semiconductor layer; forming a source layer; and forming a drain electrode, wherein the organic semiconductor layer protective layer is removed at portions to form the source and drain electrodes to reveal the organic semiconductor layer at the portions, and then the source and drain electrodes are formed on the revealed organic semiconductor layer. Employing the above method, the organic thin-film transistor is protected immediately after its formation by the organic semiconductor layer protective layer, which can prevent deterioration of the organic semiconductor layer due to air or a solvent for coating used in the manufacture, and can prevent deterioration of performance of the transistor. Further, the organic semiconductor layer protective layer can provide excellent resistance to folding, whereby deterioration due to folding of performance of the transistor can be minimized. Further, during formation of the source and drain electrodes, deterioration of the organic semiconductor layer due to air or a solvent for coating used in the manufacture can be prevented, minimizing deterioration of performance of the transistor.

In the manufacturing method of the invention of the organic thin-film transistor, a source electrode and a drain electrode are preferably formed according to photolithography as described above. The photolithography process comprises the steps of forming a light sensitive resin layer so that the light sensitive resin layer contacts an organic semiconductor layer protective layer, exposing the resulting light sensitive resin layer, developing the exposed light sensitive resin layer, removing, during or after the developing step, the organic semiconductor layer protective layer at portions to form the source and drain electrodes to reveal the organic semiconductor layer at the portions, and then forming a source electrode and a drain electrode. Even if the organic thin-film transistor of the invention is manufactured through formation of a light sensitive resin layer, exposure and development described above, deterioration of the organic semiconductor layer is minimized, since the organic thin-film transistor has an organic semiconductor layer protective layer. Further, since the organic semiconductor layer protective layer at portions to form a source electrode and a drain electrode is removed just before the source electrode and drain electrode are formed at the portions, deterioration of transistor characteristics of the organic semiconductor layer is minimized.

FIG. 3 shows an equivalent circuit diagram of one embodiment of the organic thin-film transistor sheet 10 of the invention, in which plural organic thin-film transistors of the invention are arranged.

The organic thin-film transistor sheet 10 comprises organic thin-film transistors 14 arranged in a matrix form. Numerical number 11 is a gate busline of the gate electrode of each of the organic thin-film transistors 14, and numerical number 12 a source busline of the source electrode of each of the organic thin-film transistors 14. Output element 16 is connected to the drain electrode of each of the organic thin-film transistors 14. The output element 16 is for example, a liquid crystal or an electrophoresis element, which constitutes pixels in a display. In FIG. 3, liquid crystal as the output element 16 is shown in an equivalent circuit diagram comprised of a capacitor and a resistor. Numerical number 15 shows a storage capacitor, numerical number 17 a vertical drive circuit, and numerical number 18 a horizontal drive circuit.

The method of the invention can provide an organic thin-film transistor sheet, in which organic thin-film transistors are arranged two-dimensionally on a flexible resin, having strong adhesion between the substrate and the TFT constitution layer, excellent mechanical strength, and strong resistance to folding of the substrate.

EXAMPLES

Next, the present invention will be explained employing examples, but is not limited thereto.

Example 1 Preparation of Organic Thin-Film Transistor Samples 1 through 9

(1) Preparation of Organic Thin-Film Transistor Sample 1

<Preparation of Substrate>

A mixture of 3.04 g (20 mmol) of tetramethoxysilane, 1.52 g of methylene chloride, and 1.52 g of ethanol was mixed with 0.72 g of an aqueous 0.5% by weight nitric acid solution for hydrolysis, and stirred at room temperature for one hour. A solution in which 1.60 g of diacetylcellulose L50 (produced by Daicel Co., Ltd.) was dissolved in a mixed solvent of 5.3 g of ethanol and 60.9 g of methyl acetate was added to the resulting mixture above, and stirred for one hour to obtain a dope. The resulting dope was cast on a moving gum belt through a doctor blade with a gap width of 800 µm, and dried at 120° C. for 30 minutes to obtain a substrate 1 with a thickness of 200 µm. The substrate 1 had a Tg of 226° C., which was obtained by dynamic viscoelastic measurement.

The surface of substrate 1 was corona discharged at 50 W/m²/min and then coated with a coating liquid having the following composition to obtain a layer of a dry thickness of 2 µm. The resulting layer was dried at 50° C. for 5 minutes, and hardened by being exposed for 4 seconds employing a 60 W/cm high pressure mercury lamp 10 cm distant from the layer.

| | |
|---|---|
| Dipentaerythritol hexacrylate monomer | 60 g |
| Dipentaerythritol hexacrylate dimmer | 20 g |
| Dipentaerythritol hexacrylate trimer or polymer higher than the trimer | 20 g |
| Diethoxybenzophenone (UV-initiator) | 2 g |

| -continued | |
|---|---|
| Silicon-containing surfactant | 1 g |
| Methyl ethyl ketone | 75 g |
| Methyl propylene glycol | 75 g |

The resulting hardened layer was subjected to continuous atmospheric pressure plasma treatment under the following condition to give a 50 nm thick silicon oxide layer on the hardened layer. This layer was a subbing layer 2.

| (Gas used) | |
|---|---|
| Inert gas: Helium | 98.25% by volume |
| Reactive gas 1: an oxygen gas | 1.5% by volume |
| Reactive gas 2: tetraethoxysilane vapor (bubbled with a helium gas) | 0.25% by volume |
| (Condition of discharge) | |
| Discharge output power: | 10 W/cm² |

Electrodes used were prepared as follows:

A stainless steel jacket roll base material having a cooling device (not illustrated in FIG. 2) employing chilled water was coated with an alumina thermal spray layer. After that, a solution prepared by diluting tetramethoxysilane with ethyl acetate was coated on the resulting electrode, dried, hardened by UV ray irradiation to carry out sealing treatment, and smoothed to give an dielectric layer (dielectric constant: 10) with an Rmax of 5 µm on the surface of the material. Thus, a roll electrode was obtained. Further, a hollow prismatic stainless steel pipe was processed in the same manner as above to obtain a hollow prismatic electrode as a voltage application electrode. The roll electrode was grounded.

<Formation of Gate Electrode> (FIG. 4(1))

A light sensitive resin layer 1 having the following composition was coated on the subbing layer 2 above, and dried at 100° C. for 1 minute to form a light sensitive resin layer (not illustrated) with a thickness of 2 µm.

| (Light sensitive resin layer 1) | |
|---|---|
| Dye A | 7 parts |
| Novolak resin (Condensation product of phenol, m-, p-mixed cresol, and formaldehyde, Mw = 4,000, phenol:m-cresol:p-cresol = 5:57:38 by mole) | 90 parts |
| Crystal violet | 3 parts |
| Propylene glycol monomethyl ether | 1000 parts |

Dye A

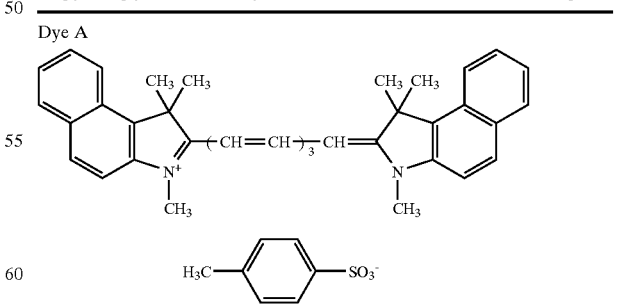

The light sensitive resin layer was exposed at an energy density of 200 mJ/cm² employing a 100 mW semiconductor laser emitting 830 nm light to give a gate busline pattern and a gate electrode pattern, and developed with an alkali developing solution to form a resist.

A 300 nm thick aluminum layer was formed on the entire surface of the developed material according to a sputtering method, and the resist was removed with MEK to obtain a gate busline and a gate electrode 8.

<Formation of Anodization Film> (FIG. 4(1))

The resulting material was sufficiently washed, and anodized in an aqueous 30% by weight sulfuric acid solution by supplying direct current for 2 minutes through a 30V low voltage power source to give an anodization film 9 with a thickness of 120 nm. The resulting layer was sufficiently washed, and subjected to vapor sealing treatment in a vapor saturated chamber at 100° C.

<Formation of Gate Insulating Layer> (FIG. 4(2))

The resulting layer was subjected to atmospheric pressure plasma discharge treatment at 200° C. to obtain a 30 μm thick titanium oxide layer a gate insulating layer 7 in the same manner as above, except that the following gas was used.

| (Gas used) | |
|---|---|
| Inert gas: Argon | 98.9% by volume |
| Reactive gas 1: a hydrogen gas | 0.8% by volume |
| Reactive gas 2: tetrapropoxytitanium vapor (bubbled at 150° C. with argon helium gas) | 0.3% by volume |

<Formation of Organic Semiconductor Layer> (FIG. 4(3))

A chloroform solution of Compound C described later was ejected onto portions of the gate insulating layer where channel was to be formed, employing a piezo type ink jet printer, dried at 50° C. for 3 minutes, and heated at 200° C. for 10 minutes to obtain an organic semiconductor layer 6 of a 50 nm thick pentacene film.

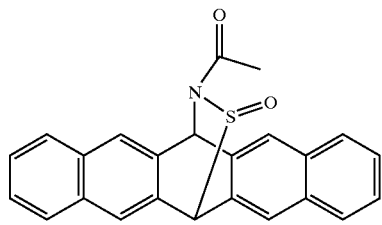

Compound C

<Formation of Organic Semiconductor Layer Protective Layer> (FIG. 4(4))

An aqueous polyvinyl alcohol solution, in which purified polyvinyl alcohol was dissolved in water sufficiently purified employing a super pure water manufacturing apparatus, was coated on the organic semiconductor layer 6, and dried at 100° C. in a nitrogen atmosphere to obtain an organic semiconductor layer protective layer 3 of polyvinyl alcohol with a thickness of 1 μm.

<Formation of Light Sensitive Resin Layer> (FIG. 4(5))

A light sensitive resin layer 1 having the following composition was coated on the organic semiconductor layer protective layer above, and dried at 100° C. for 1 minute to form a light sensitive resin layer 19 with a thickness of 2 μm.

| (Light sensitive resin layer 1) | |
|---|---|
| Dye A | 7 parts |
| Novolak resin (Condensation product of phenol, m-, p-mixed cresol, and formaldehyde, Mw = 4,000, phenol:m-cresol:p-cresol = 5:57:38 by mole) | 90 parts |
| Crystal violet | 3 parts |
| Propylene glycol monomethyl ether | 1000 parts |

<Exposure and Development of Light Sensitive Resin Layer> (FIG. 4(6))

The light sensitive resin layer 19 was exposed at an energy density of 200 mJ/cm$^2$ employing a 100 mW semiconductor laser emitting 830 nm light to give a source electrode pattern and a drain electrode pattern, and developed with an alkali developing solution to form a resist 19'.

<Removal of Organic Semiconductor Layer Protective Layer> (FIG. 4(6))

The resulting material was sufficiently washed with water to remove the polyvinyl alcohol protective layer at portions other than the resist 19'.

<Formation of Source Electrode and Drain Electrode> (FIGS. 4(7) and 4(8))

An aqueous dispersion (BAYTRON P produced by Bayer Co., Ltd.) of polystyrene sulfonic acid and poly (ethylenedioxy-thiophene) was coated on the entire surface of the resulting material, and dried at 100° C. to form a layer comprised of polystyrene sulfonic acid and poly (ethylenedioxythiophene). Further, an aqueous Ag particle dispersion as disclosed in Japanese Patent O.P.I. Publication No. 11-80647, was coated on the resulting layer and dried.

The resist 19' being removed with MEK, the resulting material was dried at 200° C. for 15 minutes in a nitrogen atmosphere to form an Ag particle fused layer, whereby a drain electrode 4 and a source electrode 5 were formed. Each electrode was comprised of a layer of polystyrene sulfonic acid and poly(ethylenedioxythiophene) with a thickness of 20 nm and an Ag particle fused layer with a thickness of 300 nm, which was provided on the layer of polystyrene sulfonic acid and poly(ethylenedioxythiophene).

(2) Preparation of Organic Thin-Film Transistor Sample 2

Organic thin-film transistor sample 2(as shown in FIG. 5) was prepared in the same manner as the organic thin-film transistor sample 1, except that neither the formation of the organic semiconductor layer protective layer nor the removal of the organic semiconductor layer protective layer was carried out. In FIG. 5, numerical numbers 1, 2, 4, 5, 6, 7, 8, and 9 are the same as those denoted in FIGS. 4(1) through 4(8).

(3) Preparation of Organic Thin-Film Transistor Sample 3

Organic thin-film transistor sample 3 (as shown in FIG. 6) was prepared in the same manner as the organic thin-film transistor sample 2, except that at the formation of source electrode and drain electrode, an aqueous dispersion (BAYTRON P produced by Bayer Co., Ltd.) of polystyrene sulfonic acid and poly(ethylenedioxythiophene) was supplied to the portions other than the resist 19' through an ink jet printer, and dried at 100° C., and the resist 19' was not removed. In FIG. 6, numerical numbers 1, 2, 4, 5, 6, 7, 8, 9, and 19' are the same as those denoted in FIGS. 4(1) through 4(8).

(4) Preparation of Organic Thin-Film Transistor Sample 4

Organic thin-film transistor sample 4 was prepared in the same manner as the organic thin-film transistor sample 1, except that steps from the formation of the organic semiconductor layer protective layer to the removal of the organic semiconductor layer protective layer were not carried out, and at the formation of source electrode and drain electrode, gold was heat deposited onto the pentacene film through a mask to form a gold layer with a thickness of 300 nm.

(5) Preparation of Organic Thin-Film Transistor Sample 5

On the surface of organic thin-film transistor sample 1 obtained above, a silicon oxide film with a thickness of 50 nm was formed as a transistor protective layer 20 according to the atmospheric pressure plasma method described above. Thus, organic thin-film transistor sample 5 (as shown in FIG. 7) was prepared. In FIG. 7, numerical numbers 1, 2, 3, 4, 5, 6, 7, 8, and 9 are the same as those denoted in FIGS. 4(1) through 4(8).

(6) Preparation of Organic Thin-Film Transistor Sample 6

Organic thin-film transistor sample 6 was prepared in the same manner as the organic thin-film transistor sample 1, except that the organic semiconductor layer protective layer was changed to a silicon oxide film with a thickness of 50 nm formed according to the atmospheric pressure plasma method described above, and an aqueous alkali solution with a pH of 13.5 was used at the removal of the silicon oxide film protective layer.

(7) Preparation of Organic Thin-Film Transistor Sample 7

Organic thin-film transistor sample 7 was prepared in the same manner as the organic thin-film transistor sample 1, except that a silicon oxide film with a thickness of 50 nm was further formed on the polyvinyl alcohol protective layer according to the atmospheric pressure plasma method described above, and at the removal of the protective layer, the silicon oxide film was removed with an aqueous alkali solution with a pH of 13.5, and then the polyvinyl alcohol protective layer was removed with water.

(8) Preparation of Organic Thin-Film Transistor Sample 8

On the surface of organic thin-film transistor sample 7 obtained above, a silicon oxide film 20 with a thickness of 50 nm was formed as a transistor protective layer according to the atmospheric pressure plasma method described above. Thus, organic thin-film transistor sample 8 (as shown in FIG. 8). In FIG. 8, numerical numbers 1, 2, 3, 4, 5, 6, 7, 8, and 9 are the same as those denoted in FIGS. 4(1) through 4(8).

(9) Preparation of Organic Thin-Film Transistor Sample 9

Organic thin-film transistor sample 9 was prepared in the same manner as the organic thin-film transistor sample 1, except that at the formation of the source electrode and the drain electrode, an Au layer (10 nm), a Cr layer (10 nm) and a Cu layer (20 nm) were formed in that order according to a sputtering method on the entire surface of the resulting material and then the resist was removed with MEK to form a source electrode and a drain electrode.

(10) Preparation of Organic Thin-Film Transistor Sample 10

Organic thin-film transistor sample 10 was prepared in the same manner as the organic thin-film transistor sample 1, except that at the formation of the gate insulating layer, the resulting anodization film was subjected to atmospheric pressure plasma discharge treatment at 200° C. employing the following gas to obtain a 30 $\mu$m thick silicon oxide layer, a gate insulating layer 7.

| (Gas used) | |
|---|---|
| Inert gas: helium | 98.25% by volume |
| Reactive gas 1: an oxygen gas | 1.5% by volume |
| Reactive gas 2: tetraethoxysilane vapor (bubbled with helium gas) | 0.25% by volume |

Example 2

Evaluation of Organic Thin-Film Transistor Samples 1 through 10

The organic thin-film transistor sample 1 and organic thin-film transistor samples 5 through 10 exhibited good working property as a p-channel enhancement type FET. With respect to the organic thin-film transistor samples 1 through 10, carrier mobility ($cm^2$/V·sec), and an ON/OFF ratio (a drain current ratio when a drain bias was −50 V and a gate bias was −50V and 0 V) were determined from a saturation region of I-V characteristic.

Further, after the organic thin-film transistor samples 1 through 10 were stored in an atmosphere for one month, the carrier mobility and the ON/OFF ratio thereof were determined.

Each of the organic thin-film transistor samples 1 through 10 was folded while the substrate side of each sample contacted a stainless steel shaft with an R of 10 mm, and then carrier mobility thereof was determined. The results are shown in Table 1.

TABLE 1

| | Immediately after preparation | | After one month storage | | After folding | |
|---|---|---|---|---|---|---|
| Sample No. | Carrier Mobility ($cm^2$/V · sec) | ON/OFF | Carrier Mobility ($cm^2$/V · sec) | ON/OFF | Carrier Mobility ($cm^2$/V · sec) | Remarks |
| 1 | 0.2 | 120000 | 0.18 | 95000 | 0.19 | Inv. |
| 2 | 0.003 | 50 | 0.0001 | 10 | No working | Comp. |
| 3 | 0.02 | 120 | 0.018 | 80 | 0.017 | Comp. |
| 4 | 0.15 | 110000 | 0.08 | 50 | No working | Comp. |
| 5 | 0.2 | 120000 | 0.2 | 120000 | 0.19 | Inv. |
| 6 | 0.22 | 120000 | 0.19 | 110000 | 0.2 | Inv. |
| 7 | 0.2 | 140000 | 0.21 | 125000 | 0.2 | Inv. |
| 8 | 0.2 | 140000 | 0.2 | 130000 | 0.2 | Inv. |

TABLE 1-continued

| Sample No. | Immediately after preparation | | After one month storage | | After folding | |
|---|---|---|---|---|---|---|
| | Carrier Mobility (cm²/V · sec) | ON/OFF | Carrier Mobility (cm²/V · sec) | ON/OFF | Carrier Mobility (cm²/V · sec) | Remarks |
| 9 | 0.2 | 120000 | 0.18 | 95000 | 0.19 | Inv. |
| 10 | 0.2 | 120000 | 0.19 | 100000 | 0.19 | Inv. |

Inv.: Invention,
Comp.: Comparative

As is apparent from Table 1 above, inventive organic thin-film transistor samples provided good characteristics as transistors, and minimized deterioration with time or deterioration due to folding.

Example 3
Preparation of Organic Thin-Film Transistor Sample 11 and its Evaluation Organic thin-film transistor sample 11 was prepared in the same manner as organic thin-film transistor sample 1, except that a mixture layer of polyvinyl alcohol and carbon black (=8:2 by weight) was used as an organic semiconductor layer protective layer instead of the organic semiconductor layer protective layer of polyvinyl alcohol. The resulting mixture layer of polyvinyl alcohol and carbon black had an average light transmittance at visible wavelength regions of 0.1%.

The organic thin-film transistor sample 10 provided the same good FET property as the organic thin-film transistor sample 1. When the sample 11 immediately after prepared was exposed to light of 500 cd through a tungsten lamp, properties thereof were not changed.

Example 4
Preparation of Organic Thin-Film Transistor Sample 12 and its Evaluation Organic thin-film transistor sample 12 was prepared in the same manner as organic thin-film transistor sample 1, except that the light sensitive layer, the source electrode and the drain electrode were formed as follows.

The following compositions A and B individually were kneaded and dispersed employing a sand mill to obtain dispersions A and B. Subsequently, dispersion A, dispersion B, and a polyisocyanate compound were mixed in a ratio by weight of dispersion A: dispersion B: a polyisocyanate compound=100:2.39:0.37, and mixed with stirring in a disslover to obtain a coating liquid. The resulting coating liquid was coated on the organic semiconductor layer protective layer 3 employing an extrusion coater, and dried at 100° C. for 5 minutes in a nitrogen atmosphere to form an ablation layer 21 {as shown in FIG. 9(1)} with a thickness of 0.3 μm. In FIG. 9(1), numerical numbers 1, 2, 3, 6, 7, 8, and 9 are the same as those denoted in FIGS. 4(1) through 4(8).

Composition A

| | |
|---|---|
| Fe—Al ferromagnetic metal powder | 100 parts |
| Polyurethane resin Vylon UR-8200 (produced by Toyo Boseki Co., Ltd.) | 10.0 parts |
| Polyester resin Vylon 280 (produced by Toyo Boseki Co., Ltd.) | 5.0 parts |
| Phosphoric acid ester | 3.0 parts |

-continued

| | |
|---|---|
| Methyl ethyl ketone | 105.0 parts |
| Toluene | 105.0 parts |
| Cyclohexanone | 90.0 parts |

Composition B

| | |
|---|---|
| α-Alumina High purity Alumina HIT60G (Average particle diameter: 0.18 μm, produced by Sumitomo Kagaku Co., Ltd.) | 100 parts |
| Polyurethane resin Vylon UR-8700 (produced by Toyo Boseki Co., Ltd.) | 15 parts |
| Phosphoric acid ester | 3.0 parts |
| Methyl ethyl ketone | 41.3 parts |
| Toluene | 41.3 parts |
| Cyclohexanone | 35.4 parts |

The resulting material was exposed at an energy density of 300 mJ/cm² employing a 100 mW semiconductor laser emitting light with a wavelength of 830 nm to ablate the ablation layer 21 at exposed portions where a source electrode and a drain electrode were to be formed, and to form a resist 21' at portions where a source electrode and a drain electrode were not to be formed. Further, the ablated material was sufficiently washed with water to remove a polyvinyl alcohol protective layer at portions other than the resist (FIG. 9(2)).

An aqueous dispersion (BAYTRON P produced by Bayer Co., Ltd.) of polystyrene sulfonic acid and poly (ethylenedioxy-thiophene) was supplied to portions other than the resist 21' through an ink jet printer, and dried at 100° C. Further, an aqueous Ag particle dispersion as disclosed in Japanese Patent O.P.I. Publication No. 11-80647, was supplied to portions other than the resist through an ink jet printer, and dried to form a drain electrode 4 and a source electrode 5 (FIG. 9(3)). FIG. 9(3) corresponds to a sectional view obtained by cutting an organic thin-film transistor as shown in FIG. 10 with line AB. In FIG. 10, numerical numbers 3, 4, 5 and 10 are an organic semiconductor layer protective layer, a source electrode, a drain electrode, and an organic thin-film transistor sheet, respectively.

The organic thin-film transistor sample 12 provided the same good FET property as the organic thin-film transistor sample 1. When the sample 12 immediately after prepared was exposed to light of 500 cd through a tungsten lamp, properties thereof were not changed.

[Effect of the Invention]

The present invention can provide a manufacturing method of an organic thin-film transistor minimizing deterioration of transistor characteristics such as deterioration with time or deterioration due to folding, an organic thin-film transistor manufactured by the manufacturing method, and an organic thin-film transistor and an organic thin-film transistor sheet each minimizing deterioration of transistor characteristics such as deterioration with time or deterioration due to folding.

What is claimed is:

1. An organic thin-film transistor manufacturing method comprising the steps of:
   a) forming a gate electrode on a substrate;
   b) forming a gate insulating layer on the substrate;
   c) forming an organic semiconductor layer on the substrate;
   d) forming an organic semiconductor layer protective layer on the organic semiconductor layer;
   e) removing a part of the organic semiconductor layer protective layer; and
   f) forming a source electrode and a drain electrode at portions where the organic semiconductor layer protective layer has been removed, so that the source electrode and drain electrode contacts the organic semiconductor layer.

2. The organic thin-film transistor manufacturing method of claim 1, wherein the organic semiconductor layer protective layer is formed so as to contact the organic semiconductor layer.

3. The organic thin-film transistor manufacturing method of claim 1, between the steps d) and e), further comprising the steps of g) forming a light sensitive resin layer contacting the organic semiconductor layer protective layer, h) exposing the light sensitive layer, and i) developing the exposed light sensitive layer with a developer.

4. The organic thin-film transistor manufacturing method of claim 3, wherein the steps e) and i) are simultaneously carried out.

5. The organic thin-film transistor manufacturing method of claim 3, wherein the developer is an aqueous alkali solution.

6. The organic thin-film transistor manufacturing method of claim 1, wherein the layer formed on the organic semiconductor layer has a light transmittance of not more than 10%.

7. The organic thin-film transistor manufacturing method of claim 3, wherein the light sensitive layer has a light transmittance of not more than 10%.

8. The organic thin-film transistor manufacturing method of claim 6, wherein the organic semiconductor layer protective layer has a light transmittance of not more than 10%.

9. The organic thin-film transistor manufacturing method of claim 1, wherein the organic semiconductor layer protective layer contains a hydrophilic polymer.

10. The organic thin-film transistor manufacturing method of claim 1, wherein the organic semiconductor layer protective layer is formed by coating an aqueous hydrophilic polymer solution or an aqueous hydrophilic polymer dispersion.

11. The organic thin-film transistor manufacturing method of claim 1, wherein the organic semiconductor layer protective layer contains inorganic oxides or inorganic nitrides.

12. The organic thin-film transistor manufacturing method of claim 1, wherein the source electrode is formed from a conductive paste containing metal particles, a conductive ink or a metal film precursor.

13. The organic thin-film transistor manufacturing method of claim 1, wherein the drain electrode is formed from a conductive paste containing metal particles, a conductive ink or a metal film precursor.

14. The organic thin-film transistor manufacturing method of claim 1, wherein the source electrode contains a conductive polymer.

15. The organic thin-film transistor manufacturing method of claim 1, wherein the drain electrode contains a conductive polymer.

16. The organic thin-film transistor manufacturing method of claim 1, wherein the substrate is comprised of a resin.

* * * * *